United States Patent

Johnson

[19]

[11] Patent Number: 5,937,515
[45] Date of Patent: Aug. 17, 1999

[54] RECONFIGURABLE CIRCUIT FABRICATION METHOD

[76] Inventor: Morgan T. Johnson, 2370 SW. Cedar, Portland, Oreg. 97205

[21] Appl. No.: 08/971,758

[22] Filed: Nov. 17, 1997

Related U.S. Application Data

[63] Continuation of application No. 08/428,652, Apr. 25, 1995, abandoned.

[51] Int. Cl.⁶ .............................. H05K 3/32; H05K 3/36; H05K 3/46
[52] U.S. Cl. ................................ 29/847; 29/830; 29/831; 29/832; 29/850; 29/884
[58] Field of Search .............................. 29/593, 830, 831, 29/832, 846, 847, 850, 852, 884; 216/59, 65, 66; 361/739; 439/54, 66, 883, 219

[56] References Cited

U.S. PATENT DOCUMENTS

| | | | |
|---|---|---|---|
| 4,234,888 | 11/1980 | Calhoun et al. | |
| 4,597,617 | 7/1986 | Enochs | 439/66 |
| 4,628,406 | 12/1986 | Smith et al. | |
| 4,647,959 | 3/1987 | Smith | 257/668 |

(List continued on next page.)

OTHER PUBLICATIONS

"Aptix Programmable Interconnect Brochure", Date Unknown.
"Aptix takes radical approach to pcbs, Electronic Engineering Times, Apr. 27, 1992, p. 94".
"Systems Ees see future in 3–D, Electronic Engineering time, Sep. 24, 1990, p. 37".
"Harwin Chiprack (TM) Brochure" Harwin, Inc., New Albany, In. Date Unknown.
"Demountable TAB Aids Rework and Repair, Connection Technology, Dec. 1991, pp. 26–30".
"CPLD Module Packs 50K Usable Gates, 360 I/O Pins, Electronic Design, Apr. 4, 1994, pp. 45–48".

*Primary Examiner*—Peter Vo
*Attorney, Agent, or Firm*—William A. Birdwell & Associates

[57] ABSTRACT

A method of manufacturing electronic circuitry and the resulting hardware is described in which a conduction plate is formed achieving separate electrical conducting paths for application specific signals is engaged with an electronic circuit package containing a wide range of elements including one or more integrated circuits, chip packages, multichip modules printed circuit boards and cables. One or more of these elements are assembled into the circuit package where all or a major portion of the element conductors are routed to terminals positioned for electrical connection between the circuit apparatus and the electrical conduction plate. The conduction plate completes the electrical interconnection of the circuit package by providing the application specific conduction paths, using various techniques for creating electrical conduction, such as severing segments of a generalized conductive grid to establish desired conduction paths. The conduction plate, being separate and separable from the circuit package, enables separate design, manufacture, testing and repair of the circuit package and the conduction plate before or following final assembly of the conduction plate and circuit package. Intermediate conduction plate structures may be used to test the devices and the circuit package before final assembly, and the operational conduction plate customized to avoid defects located in the test procedure. Very substantially increased size and capacity of computers and related devices can be achieved in the same or smaller footprint using this invention.

10 Claims, 8 Drawing Sheets

U.S. PATENT DOCUMENTS

| | | | |
|---|---|---|---|
| 4,652,974 | 3/1987 | Rayan | 361/739 |
| 4,685,033 | 8/1987 | Inoue | 29/831 X |
| 4,700,214 | 10/1987 | Johnson | 437/73 |
| 4,720,470 | 1/1988 | Johnson | 437/73 |
| 4,720,915 | 1/1988 | Kennedy et al. | 29/847 |
| 4,736,521 | 4/1988 | Dohya | 29/830 |
| 4,891,585 | 1/1990 | Janko et al. | 324/72.5 |
| 5,048,178 | 9/1991 | Bindra et al. | 29/830 |
| 5,055,907 | 10/1991 | Jacobs | 257/773 |
| 5,109,555 | 5/1992 | Sample et al. . | |
| 5,155,905 | 10/1992 | Miller, Jr. | 29/847 X |
| 5,165,166 | 11/1992 | Carey | 29/847 |
| 5,199,165 | 4/1993 | Crawford et al. | 29/846 |
| 5,237,743 | 8/1993 | Bucsacco et al. | 29/884 X |
| 5,329,695 | 7/1994 | Traskos et al. | 29/830 |
| 5,497,545 | 3/1996 | Watanabe et al. | 29/830 |
| 5,509,203 | 4/1996 | Yamashita | 29/884 X |

RECONFIGURABLE CIRCUIT FABRICATION METHOD

This application is a continuation of application Ser. No. 08/428,652 filed on Apr. 29, 1995 now abandoned.

TECHNICAL FIELD

The present invention relates to electronic hardware systems and the manufacture, testing and repair thereof. More particularly, this invention relates to a novel interconnect method and the resulting apparatus which method permits the formation of electronic circuitry which is more versatile than prior art methods. Very substantially increased size and capacity of computers and related devices can be achieved in the same or smaller footprint using this invention.

BACKGROUND ART

Electronic circuit components and systems have become increasingly complex and the design of these components and systems has correspondingly become more time consuming, complex and subject to increasingly higher failure rates. The prior methods of making electronic circuits has led to problems in testing and manufacturing, since the act of prior art connections of the devices may cause failure of the otherwise acceptable device. Soldering temperatures and conditions used in the fabrication of prior art circuitry lead to occasional failures and inadequate conductor joints. These problems may not be discoverable in prior devices until after the device is completely assembled. With prior art systems, the integrity of the mounting connections to the devices is difficult to verify. Wire wrap techniques are time consuming and require the conductors from the devices to either be individually connected to respective conductors, or to pierce a "flex" which contains reconfigured conductors to establish the desired circuitry.

Prior art techniques for the assembly of electronic devices presently call for preparation of a substrate containing the wiring, such as a printed circuit board or the like, upon which the devices, such as chips, capacitors, resistors, inductors, subassemblies, digital or analog devices in the form of packaged or bare die, multichip modules, hybrid devices and the like, are directly mounted, usually by the use of a soldering technique or other method to achieve a secure contact. In design, assembly and use, including maintenance and upgrades, devices which are assembled cannot be easily disassembled without damage, and therefore when found defective or upon failure, the entire assembly must be replaced and discarded. Reassembly and reuse of such devices has not generally been practical nor economical. Recall of significant components of computers when a design flaw is discovered has heretofore resulted in the discard of significant quantities of otherwise useful devices at great cost.

Materials and structures well suited for the manufacture of wiring are frequently ill suited to the creation of a durable, robust device mounting surface.

Conversely, materials which are well adapted to forming a device mounting surface make poor wiring. Any changes needed in the number of devices, their type or location requires a new wiring structure and any testing or burn in of the devices must be redone.

Mounting devices on wiring makes disassembly difficult because such manipulation will frequently damage the devices, the wiring or both. Structures which allow routine dismounting of devices are generally unsuited to the fabrication of wiring. Conversely, structures particularly suitable for creation of wiring do not lend themselves to be mounting on devices for both structural and materials of composition considerations. Device mounting frequently involves temperature, physical forces, and chemical reactants which can damage wiring. Consequently, wiring must be constructed with protective coverings or be made excessively robust to withstand assembly with and disassembly from the devices.

For devices mounted on wiring, the wiring must supply the physical structure to hold and protect the devices.

Because of the aforementioned problems the prior art wiring and device assemblies do not lend themselves to changes and retrofits during design and production or to field upgrades and maintenance.

Similarly, unification of device and wiring in prior devices results in limited access at all phases of design, production, quality control and use for troubleshooting and testing of the devices. Prior art cabling between electronic assemblies is generally fixed in nature and not easily reconfigured.

Attempts to solve these and other problems have been evolved only for the design and prototype phase and are unsuitable for production quantities of devices for reasons of cost, structures and signal integrity, As a result, prior efforts have resulted in most cases in a prototype-only technology.

In electronic circuits, the active circuit elements are connected to each other with wires or other electronic conductors. These connections among elements are known as interconnect. In the past, the performance and cost of the whole electronic system was mostly determined by the design of the active devices. However as system performance has increased and size has been reduced, the interconnect has had to become more sophisticated. Today, the cost of all of the different levels of interconnect is at least as great as the cost of the active elements, and the performance of the whole system now depends critically on the design of the interconnect.

Ball grid arrays are well known in which packaged integrated circuit chips are mounted on a surface of a substrate, and electrical connection to electrically conductive materials not a part of the packaged integrated circuit, such as a printed circuit board, is made by an array of solder balls located on a surface of the substrate opposite the surface to which the devices are attached. Passive components such as resistors or capacitors can also be mounted on the top surface of the substrate. The substrate can be a multi-layer structure, electrically conductive traces and or regions being formed on a surface of each layer of the substrate, such as is described in U.S. Pat. No. 4,976,761 to Chu. The integrated circuit chip or chips and the passive components are typically encapsulated in plastic to protect the chip or chips from the external environment. The chips are electrically connected to the substrate by wirebonding, tape automated bonding, or flip-chip interconnection. Ball grid arrays allow a high density of external chip connections to be made as compared to other packaged integrated circuits having leads extending from the package.

When interconnect for electronic systems is designed, there are three major areas of concern. First is the signal fidelity that can be provided by the interconnect. This encompasses the electrical characteristics of the conductors, and includes resistance, capacitance and inductance. In modern electronic systems, the signal delay from pin to pin is increasing in importance. It is desirable to minimize the delay. It is also important that the delay be known, and in some systems it is important to be able to predict the delay. Another aspect of signal quality which is important is cross-talk between conductors. Cross-talk is the lack of isolation of one signal from another. In prior art systems, whenever performance issues dictated a revised routing to eliminate cross talk, even if there was no need to change the devices, a new wiring had to be created and the testing and burn in repeated.

The second major interconnect design criteria is size. This includes the total number of pin-to-pin connections that can be achieved; the physical size of the interconnect; the density of the interconnect in connections per unit space; and the routability of the connections. Routability is the ability to electrically connect all given pins to any other pins as required by the design. Most interconnect systems are not 100% routable because there are limitations, or rules, constraining the connections between selected pins. Another aspect of size is scalability. This is the ability of an interconnect method to be practical across a wide range of production quantities. If the interconnect method must be changed as a given system increases production quantities, there is significant risk that the function and/or performance of the high-volume method will be different from that of the low-volume one.

The third major interconnect design criteria is cost. This is closely tied to both production quantity and the time required to complete the design. The ideal interconnect method can promptly deliver parts after each stage of the design, at low cost, and can then continue to provide parts at competitive cost as production quantities increase into the thousands. The amount and type of equipment required in manufacturing has a large effect on cost. The time that it takes to manufacture the interconnect generally increases with cost. Rapid part delivery is desirable so that product development cycles can be shortened and redesigns can occur more quickly.

There are two broad methods of creating conductors. In one, the conductors are produced after the design is created. An example of this approach is the etching of the conductors on a printed circuit board. The second approach is to produce the conductors prior to the design and create the conductors by removing the material not required by the design.

A number of approaches have come to be used in an attempt to satisfy all of the ideal design criteria. All approaches must in some way deal with the problem of manufacturing the complexity which is inherent to interconnect. One way to deal with the complexity is to make a single complicated structure, such as a photomask, which is then easily replicated. Interconnect manufactured in this way includes printed circuit boards, most multi-chip modules, hybrid circuits, on-chip wiring, and lead frames. Because the manufacture of the initial complex structure is expensive, all interconnect manufactured in this way suffers from the critical disadvantage that it is very expensive and time consuming to produce in small quantities. This means that prototypes can not be quickly and economically produced using these techniques.

The other major way in which the inherent interconnect complexity is manufactured is through a simple step by step method for creating complex structures. Present examples of this approach are field-programmable logic devices (FPLD), field-programmable gate arrays (FPGA), cross-point switches, fuses, anti-fuses, wire bonds, wire wrap, emulators, direct write e-beam, laser deposition, ion-milling, and thick-film ink jet writing. All of these methods use some structure whose easily modified placement or configuration creates the particular pattern of connections required for a given design. Those approaches which route the signals through active devices or non-homogeneous conductors suffer from signal fidelity problems. Generally signal delay is long or resistance is high. The approaches which use homogeneous conductors (wire bonds, wire wrap) suffer from limitations of size. They are useful only for relatively small numbers of connections and are relatively expensive to produce in large quantities.

There are techniques for creating interconnect which hybridize the two ways for creating complexity. An example of this is laser-programmed gate arrays. These circuits are built nearly to completion using standard photomasks, then the last few layers of interconnect are patterned using a laser. The laser is used to disrupt unwanted connections in a metal pattern which connects each node to every other node on the die. While useful, this does not offer a broad solution to the general interconnect problem. The system designer is constrained by the design of the base gate array, the interconnect does not span more than one integrated circuit, and the interconnect is monolithic with the active devices. In monolithic devices, the manufacturing steps for the active devices are followed by the manufacture of the interconnect, all on the same physical structure. Thus if a defect occurs in either, the whole device is defective. This limits the yield with increasing scale, and hence raises the cost of monolithic devices. Another limitation of monolithic devices is that the interconnect can not be separated from the active devices after manufacturing for repair or redesign.

While all of these techniques provide advantages in the manufacture of electronic interconnect, none satisfy all of the needs for rapid manufacture of low-cost, high pin count, high signal quality interconnect, including: large number of connections, low resistance, controlled impedance, high routability, short propagation delay, low cost in quantity one, and the ability to change the connections with minimal expense or delay. Similarly, access for testing is inhibited by the permanent and direct mounting of the devices on wiring in the prior art systems.

DISCLOSURE OF THE INVENTION

A method for manufacturing electronic systems and the resulting apparatus is disclosed in which electronic apparatus is constructed with devices or other interconnect attached to a device plate, the circuitry programmed or formed in a separate electrical conduction plate and the separate portions of the apparatus then assembled together and mounted in a non-destructive fashion into the working assembly. Multiple device plates assembled together are contemplated. The device plate may be separated from the electrical conduction plate and from other device plates without damage thereto. The desired electronic circuit is created by the assembly of the electrical conduction plate with the device plate in a carefully and precisely indexed relationship with terminals on the conduction plate engaging terminals on the device plate. Each of the elements can be tested to verify its function prior to assembly. The electronic package can be probed to assure no shorts or opens exist in a traditional bare-board method.

The devices are emplaced upon a carrier to form a device plate with the conductor leads from the devices extending within or through the carrier to accessible contact locations. Contact pads or bumps are formed on the lead at the accessible contact location for subsequent contact with interconnect means such as an array of contact pads distributed on the surface of the electrical conduction plate in a pattern which may mate with and establish contact with the array of pads on the device plate. The device plate may be composed of a suitable dielectric material such as a ceramic, a polymer or reinforced polymer which provides the desired characteristics of adequate structural strength, dimensional stability, insulative values, and being easily fabricated into the desired configuration so that the conductors from the devices may pass within or through the device plate to the accessible contact location at which contact pads or bumps are formed. The device plate performs the function of redistributing the contact location of the device pads or pins to an accessible predetermined pattern or grid of contact pads or bumps and provides the physical structure and protective support for the devices. In addition, the device plate may also provide power supply and ground to the devices as well as thermal pathways for cooling or thermal management. One or more additional device plate may be assembled to form a stack with provision for routing device signals along discrete pathways through adjacent device plates.

The interconnect circuitry in the conduction plate is formed by fabrication techniques such as conventional printed circuit boards, laser, ion beam, or other fabrication and programming techniques to personalize the circuitry for the specific device plate or class of device plates contemplated, with terminals or conductor pads strategically positioned for contact with the terminals or conductor pads on the surface of the device plate. One time programmable wiring such as fuse or antifuse wiring patterns may be used. Re-programmable wiring techniques as well as other ways of forming the interconnect wiring pattern in the electrical conduction plate with exposed terminals on the surface thereof may be used. One preferred method of manufacturing the electrical conduction plate is to form multiple layers of metallic ribbon wires separated from each other by dielectric layers and connected in an array of communications with distribution terminals and device terminals as contact locations in a multi layer grid. Predetermined individual zones of the wire conductor segments are severed by the application of an energy beam such as a laser milling beam, a particle beam such as an ion beam or the like at strategically predetermined locations to establish the desired wiring pattern. A wiring pattern may be composed of break-link, make-link or both to provide initial configuration and later repair and change in local areas of the conductors. The pattern may be customized to reflect the operability of the devices and the device plate by an evaluation thereof using a test electrical conduction plate in an evaluation step before assembly of the customized operational electrical conduction plate upon the device plate. The optimum routing of signals and utilities may be performed by a computer controlled laser, the computer operating using an ECAD data base with specific routing instructions for the intended device. Additional information on location of defects and/or operational information on the devices may be included to optimize performance of the resulting structure. The data base thus contains the user's design criteria and the unique information about the device in a net list or other representation which is used as input for an auto router.

Upon completion of the routing stage, a post processor program assigns machining instructions to the laser system, the electrical conduction plate being fabricated is mounted in the laser system, and all unwanted connections are machined away at high speeds such as several hundred to several thousand severed connections per second. This process leaves only the desired connections on the electrical conduction plate.

The electrical conduction plate must have strength and stability in least two dimensions in order to provide the required indexing and registry with the device terminals on the device plate. The electrical conduction plate may be tested off chip for defects and then assembled in registry with the device plate or plates to form the completed operational device, multi chip module or other electronic devices of complexity varying from single chip configurations to the most complex of electronic devices presently known or contemplated. Interconnect wiring can be prepared to test various of the functions and other aspects of the devices in or on the device plate so that the device plate can be initially tested before assembly and can be tested later upon failure or for troubleshooting by removal of the operational electrical conduction plate. Reconfiguration, upgrading, or optimization activities may be accomplished in a manner heretofore unknown. In this way defective device components may be located and eliminated from a circuit without loss of the entire assembly. A very large device or assembly of devices can be mapped to locate any defective components therein and an operational interconnect wiring designed around the defects. In a large complex assembly, test wiring can be configured to burn in the devices before final assembly. The large device may be configured or optimized. The test wiring assembly may also be used to assist in the optimization of the overall device to check for and minimize or eliminate cross talk, optimize circuitry speeds and the like. The information gleaned from the test would then be used to design a customized or personalized pattern in the electrical conduction plate.

The terminal connections between the electrical conduction plate and the device plate can be made temporary, such as for testing purposes, removable, such as for troubleshooting, analysis or upgrading of the device operations, or can be permanent if desired. Additionally, the assembly can be temporary with anticipation of changes during the design and prototyping phase of development of an electronic system, or may be permanent for use in the production phase. Changes in the circuitry are readily accomplished since devices are not permanently affixed to the electronic conduction plate and a new electronic conduction plate can be readily prepared to accomplish changes in the circuitry dictated by design changes, subcomponent failure or reuse of old components in new systems. The connections between terminals can be enhanced by use of dendritic sheets adapted to enhance electrical connections.

Further, if the devices need to be changed, added to or otherwise modified, the electronic package can be manufactures in a manner robust enough to allow multiple alterations without damage to the structure. Since the electronic conductor plate is not associated with the electronic package during these actions, it is not placed at risk by the revisions and alterations. The new devices and their mounting can be tested prior to assembly with the conductor plate.

In prior art techniques there is no satisfactory way to test the mounted devices, particularly for defects arising from the prior art assembly techniques. In the invention as described herein, testing is easily accomplished at any stage of the assembly and in fact can be undertaken later, by simply disassembling the electrical conduction plate from the device plate and attaching the appropriately designed test interconnect, such as a specially designed electrical conduction plate to test for the phenomena desired. When a defective component is located or if the operational parameters of the devices is to be changed, augmented or bypassed, a new electrical conduction plate having customized routing of signals, power, ground and the like can be prepared to meet the needs of the device and its application at minimal cost without the need for a new device plate.

Thus, a repair feature of the assembled system is now possible, which was unknown in the prior art. One can now salvage many of the devices which have heretofore been discarded when a problem arose in the operability of the device or the system including the device. Upgrading and optimization of the systems can now be undertaken in an economically feasible manner. New applications for old circuitry and devices is now possible. Very substantially increased size and capacity of computers and related devices can be achieved in the same or smaller footprint using this invention.

BRIEF DESCRIPTION OF DRAWINGS

FIG. 6 is a schematic plan view of one embodiment of a layer of metal grid forming the lowermost metal layer of the electrical conduction plate segment shown in FIG. 5a.

BEST MODE FOR CARRYING OUT THE INVENTION

Referring now to the drawings, wherein like numerals indicate like parts, there is seen in FIGS. 1, 1a, 17 and 18, an electronic device assembly comprising a device plate 40 and a electrical conduction plate 20. Device plate 40 has devices such as chips 48 attached thereto at device mounting terminals 46, with conductors 45 extending through the dielectric sheet 42 to device terminals 68. Terminals 68 are preferably gold bumps or similar contact pads well known in the art for electronic contact surfaces. Power supply 28 brings power to the device assembly and ground 32 provides grounding to the device. Ground pins 50, clock pins 52 and VCC pins 54 depend from device plate 40 in locations suitable for engagement with an electronic assembly in a well known fashion.

Removable electrical conduction plate 20 is formed of a dielectric material such as a ceramic a polymer or other material having the electrical and mechanical properties needed for the support and construction of wiring for electronic devices. Preferably, a ceramic substrate 22 is used to support and locate the elements of the electrical conduction plate 20. As is best seen in FIG. 18, metal conductor layers 28 are laid upon the electrical conduction plate separated by dielectric layers 34 and 35 and are in electrical contact with the distribution terminals 26. Each distribution terminal is attached to conductors as shown so that twelve potential cutting zones represented by curved locator lines 33 in cell A of FIG. 17 are present to customize or personalize the wiring as shown in FIG. 17.

Figure 1:
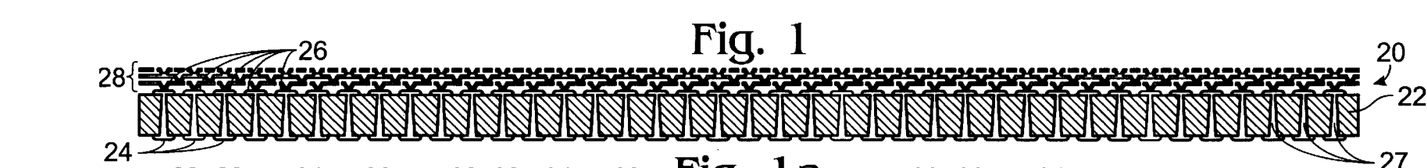
FIG. 1 is a schematic cross sectional view of a portion of the electrical conduction plate incorporated as a part of an electronic device system using the concepts of this invention.
Figure 1A:
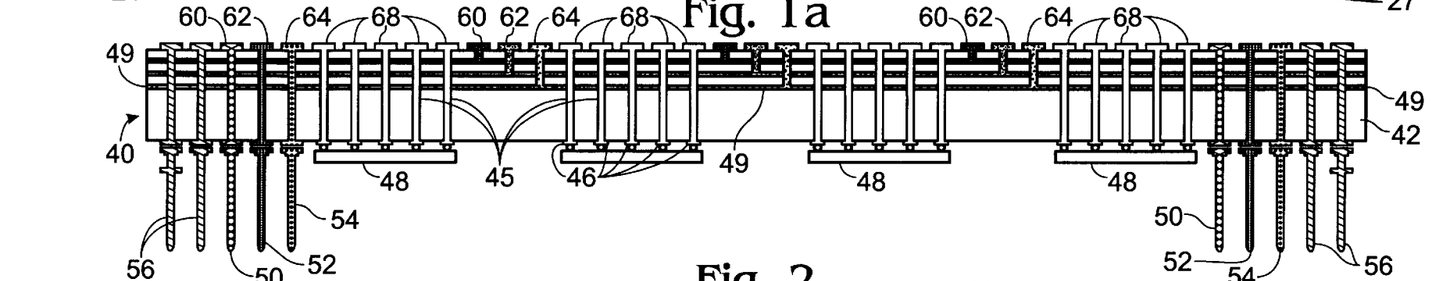
FIG. 1a is a schematic cross sectional view taken along lines 1a—1a of FIG. 2 showing a portion of a device plate having routed signal, (VCC), ground, clock and package pins in an electronic system incorporating the concepts of this invention.

The electrical conduction plate 20 has a plurality of electrical conduction plate terminals 24 arrayed in a manner to contact at least some of the device plate terminals 68 and the ground terminals 60, the clock terminals 62 and the VCC terminals 64. Wiring 28 interconnects the various electrical conduction plate distribution terminals in a wiring pattern determined by the desired functional characteristics of the ultimate device in a manner described at length below and provides the connections among various electronic functions of the chips or devices 48. The electrical conduction plate 20 may be assembled upon device plate 40 by pressing downwardly in registry so that the contact is made between the desired electrical conduction plate terminals and device plate terminals 60, 62, 64, and 68. The electrical conduction plate 20 and the device plate 40 are keyed together and held in registry by indexing means comprising index pins 21 located to engage and key into index apertures 23. Other well known indexing means may be used to insure that proper registry of the elements occurs.

Figure 2:
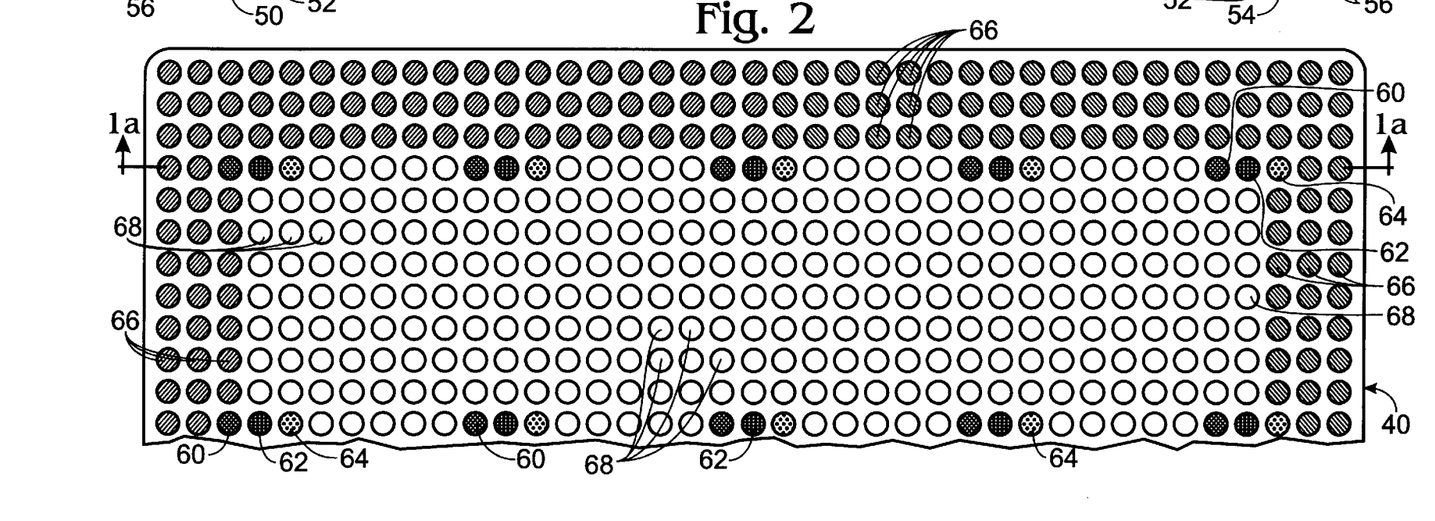
FIG. 2 is a partial plan view of the device shown in FIG 1a showing the exposed terminals thereon.

In FIG. 2 the upper surface of the device plate of FIG. 1a is shown with a typical array of ground terminals 60, clock terminals 62, VCC terminals 64, package terminals 66 and device terminals 68. The outer five rows of terminals are connected to depending ground pins 50, clock pins 52, VCC pins 54, and package pins 56 as shown. Device plate 50 carries a plurality of electronic devices such as chips 48 soldered on the lower surface thereof with connectors as shown extending upwards through device plate 50 terminating at device plate terminals 68.

Figures 3, 3A:
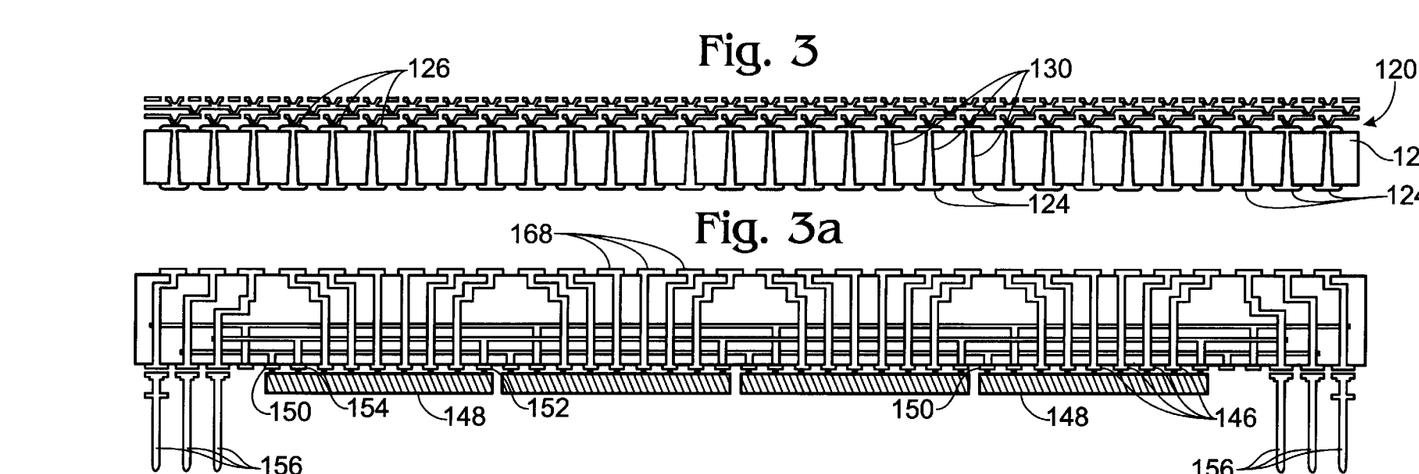
FIG. 3 is a schematic cross sectional view of a portion of the electrical conduction plate of a second embodiment of this invention incorporated as a part of an electronic device or system having routed signals only using the concepts of this invention.
FIG. 3a is a schematic cross sectional view taken along lines 3a—3a of FIG. 4 showing a portion of a device plate having routed signals with VCC, ground, and clock circuits connected directly to the devices in an electronic system incorporating the concepts of this invention.
Figure 4:
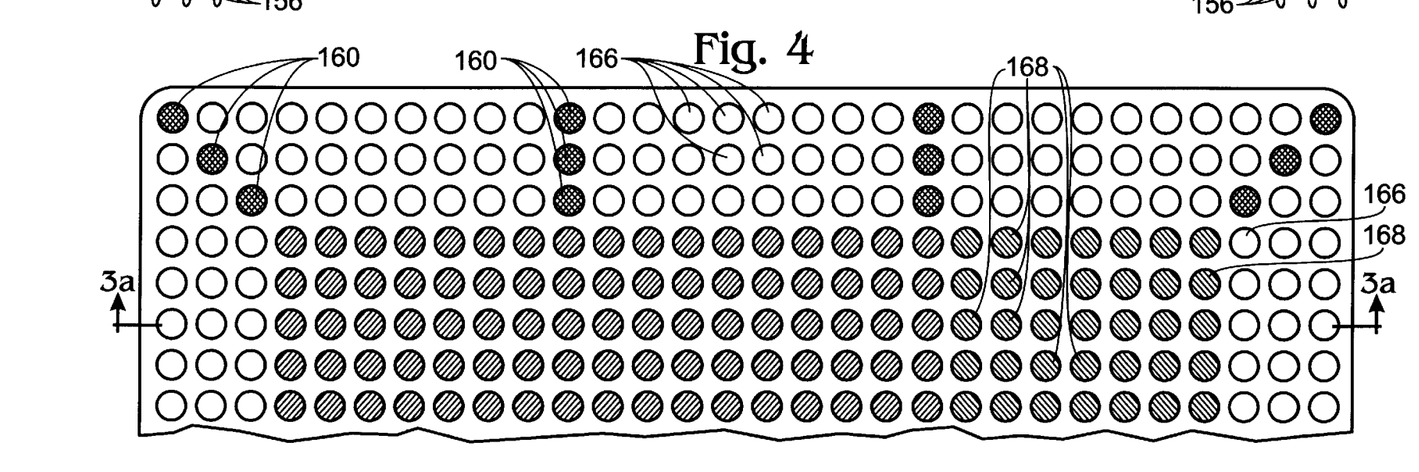
FIG. 4 is a partial plan view of the device shown in FIG. 3a showing the exposed terminals thereon.
Figure 5:
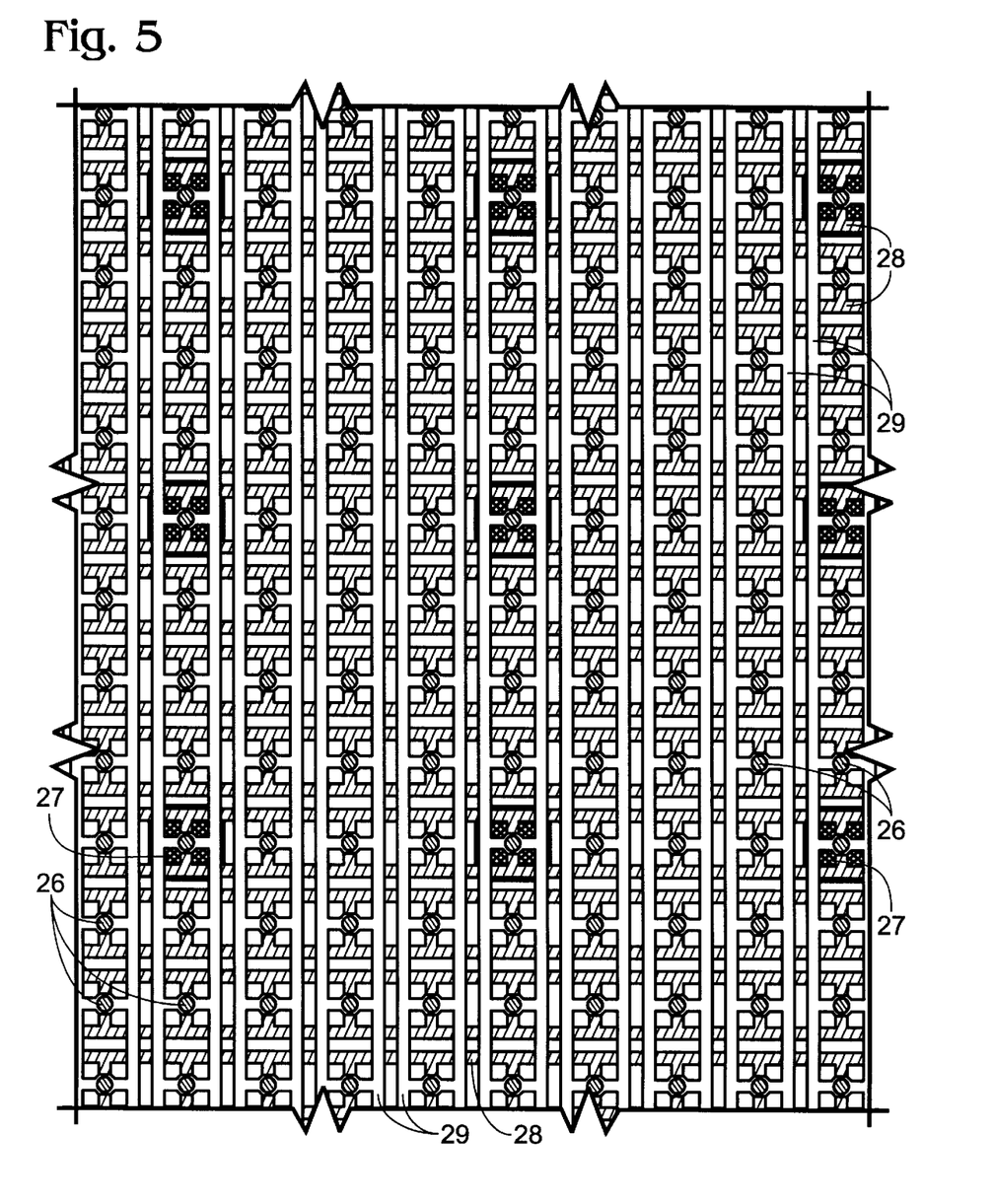
FIG. 5 is a much enlarged plan view of a portion of the electrical conduction plate having two levels of metal with distribution terminals interconnected to said metal levels ready for programmed laser, particle or energy beam machining into the desired wiring configuration.
Figure 5A:
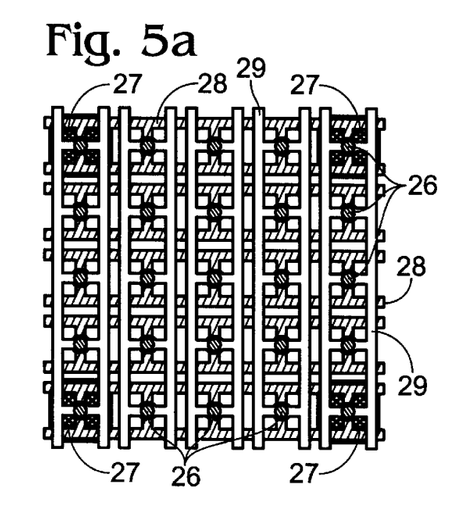
FIG. 5a is a very much enlarged segment of the device shown in FIG. 5 showing the pattern of the two layer metal conductors and wiring distribution terminals ready for programmed machining to establish the desired wiring pattern.
Figure 6:
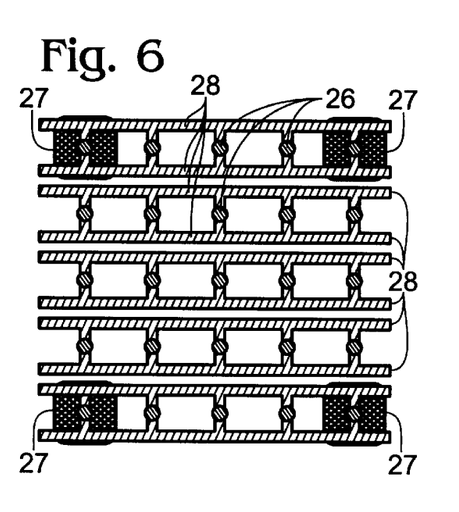
Figure 17:
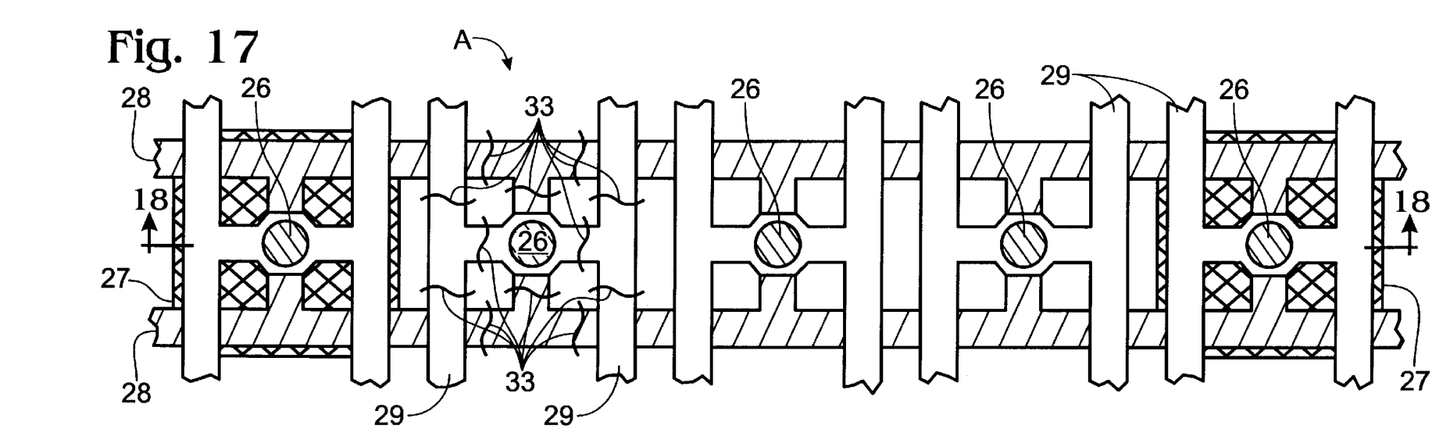
FIG. 17 is a very greatly enlarged plan view of a portion of one row of wiring terminals and distribution terminals shown in FIG. 5.
Figure 18:
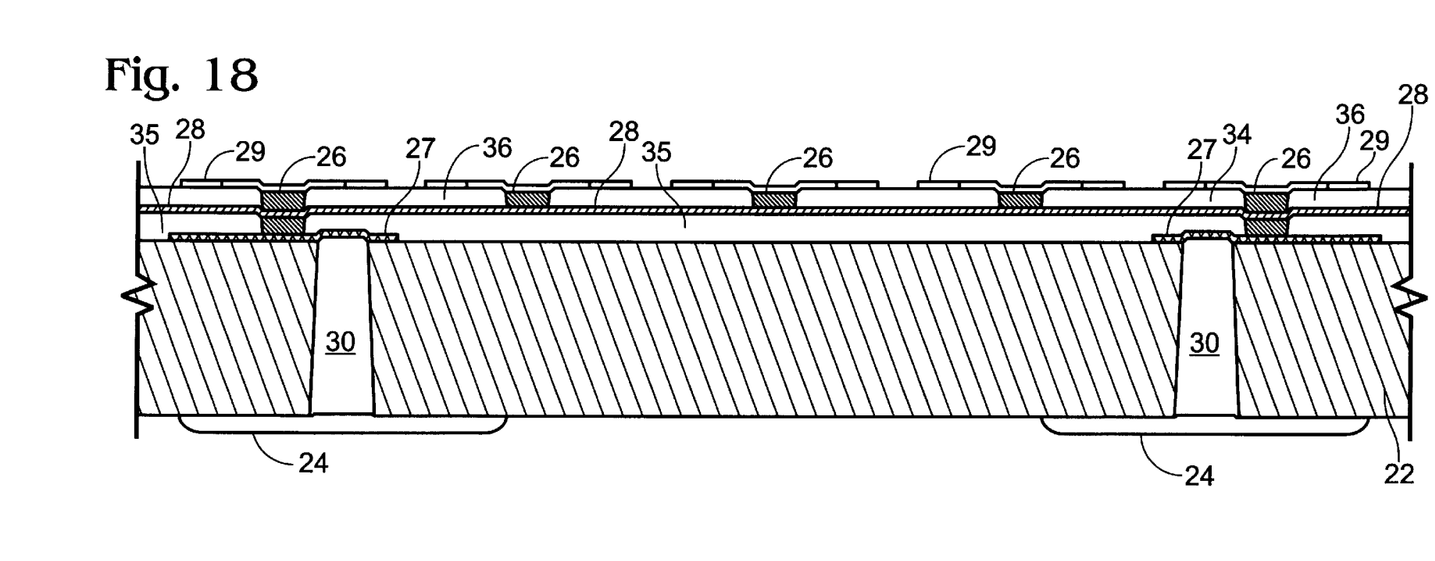
FIG. 18 is a cross sectional view of the apparatus shown in FIG. 17, taken along lines 18—18 of FIG. 17.

FIGS. 5 through 11 and with occasional reference to FIGS. 17 and 18, show various aspects of an embodiment of the electrical conduction plate of this invention having two layers of metal used to form the wiring pattern by laser or particle beam machining. The unique manner in which the electrical conduction plate is assembled and configured is shown, including the concepts utilized in forming the desired conductor path for the specific array of devices carried by the device plate and their specific circuitry needs. In FIG. 5 a segment of a typical electrical conduction plate of this invention is shown. Electrical conduction plate distribution terminals 26 are shown as solid dots distributed throughout the array and are conductively connected to the lower metal conductor layer 28 and the upper metal conductor layer 29. A very much enlarged plan view of an even smaller portion of the electrical conduction plate upper surface of FIG. 5 is shown in FIG. 5a in which distribution terminals 26 are dispersed in a substantially rectangular array with registry enhancing conductor plates 27 positioned beneath every fourth distribution terminal 26 for engagement with electrical conduction plate terminals 24. Five cells of one row of the electrical conduction plate shown in FIGS. 5 and 5a are depicted in FIGS. 17 and 18. The communication between selected distribution terminals 26 and electrical conduction plate terminals 24 is conveniently established by use of registry enhancing conductor plates 27, with conductors 30 positioned as shown between electrical conduction plate terminals 24 and plate 27. The electrical conduction plate terminals are spaced at regular intervals intended for registry with corresponding device terminals 68 or 168 shown in FIGS. 1a and 3a and are advantageously located at intervals of approximately 25 mils or less. More particularly, the interval at which the electrical conduction plate terminals 24 are located is established to mate with precision with the device plate terminals 68 or 168 as described above with respect to FIGS. 1–4. FIG. 6 shows the array of metal conductors 28 engaging distribution terminals 26 for the lowermost level of metal 28 in the multiple layer electrical conduction plate shown in FIG. 5. An array similar to the array shown in FIG. 6 may then be formed as a second layer rotated 90° with respect to the lowermost layer with a suitable insulative dielectric material 34. A second layer of dielectric material 35 is shown emplaced between the lower metal layer 28 and the registry conductor plates 27 (see FIG. 18). The resulting two-layer master grid includes accessible connections in the X and Y axes of the wiring pattern. In this simplified master grid, the pattern is visually simple and without features hidden by the upper layer. In FIG. 18 the substrate 22, which may be a suitable ceramic or polymer having appropriate dielectric properties, is shown supporting a lower layer of dielectric material 35 which in turn supports the bottom layer of metal wiring 28. The top layer of metal wiring 29 is separated from the lower layer 28 by dielectric layer 36. Additional layers of metal conductors may be added with the portions of the metal in each layer connected to the distribution terminals radiating at diverse angles therefrom so that locations for laser machining to customize the array are not occluded by superjacent layers of metal.

Figure 7:
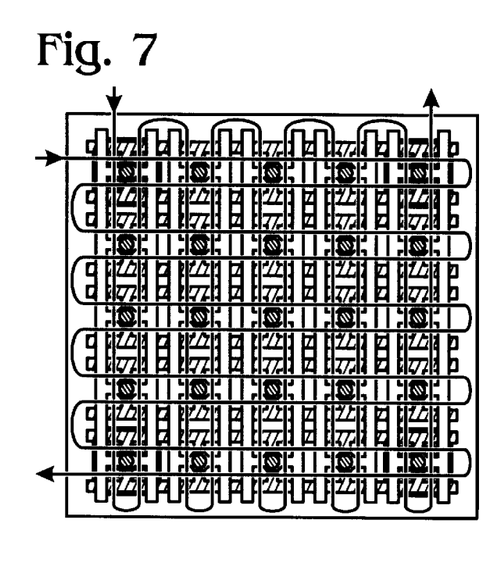
FIG. 7 is a view similar to FIG. 5a showing typical paths of a machining tool such as a laser used in selectively severing elements of the grid to program the wiring into the desired wiring pattern within the electrical conduction plate.
Figure 8:
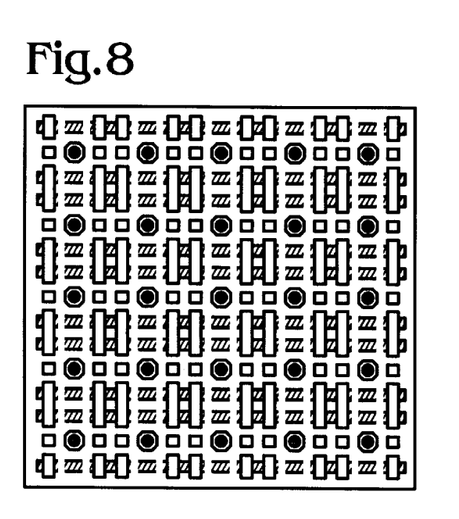
FIG. 8 is a view similar to FIG. 5 showing a master grid of all possible cuts for programming the electrical conduction plate segment of FIG. 5.
Figure 9:
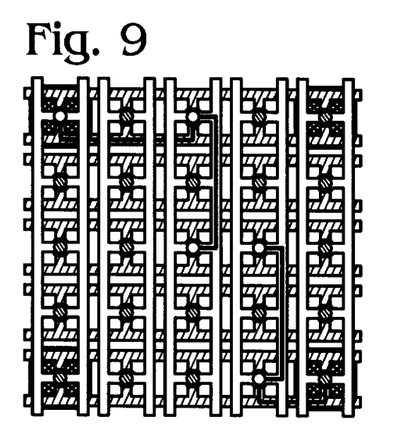
FIG. 9 is a portion of a typical wiring pattern connecting two of the electrical conduction plate terminals designed in preparation for machining of the unwanted wiring sites.
Figure 10:
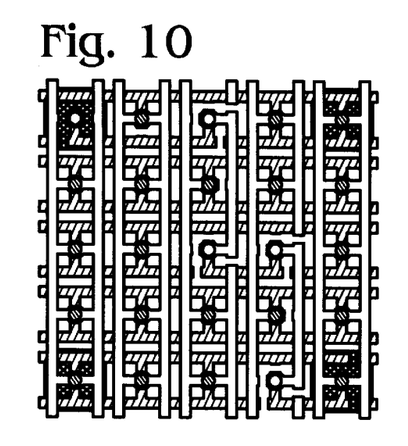
FIG. 10 is a portion of a typical wiring pattern after machining to sever the unwanted connections using the minimum cuts needed to establish the desired wire pattern of FIG. 9.

In FIG. 7 the possible paths of a laser or ion beam which is used to sever selected portions of the metal wire is shown in one embodiment of this invention. The path of travel traverses all of the possible locations of the metal layers 28 and 29 at which wires may be severed to form a desired wiring configuration. In FIG. 8, all the wires are shown machined away from the distribution terminals 26. In the preparation of an operable circuit, only selected wires are severed, leaving only the desired pattern interconnecting the distribution terminals on the electrical conduction plate. To set up a typical grid pattern of cuts to result in a desired configuration, the pattern is first drawn out as in the example shown in FIG. 9. The cutting pattern shown in FIG. 10 is designed to utilize the minimum cuts possible to attain the desired wiring pattern of that shown in FIG. 9. This configuration minimizes the thermal stress and potential damage to the electrical conduction plate which could possibly occur if the maximum cut procedure is used to achieve the pattern of FIG. 9. FIG. 10 thus shows the connections of FIG. 9 being made by severing conductors at 68a, 68b and 69a, 69b.

Figures 11, 12, 13:
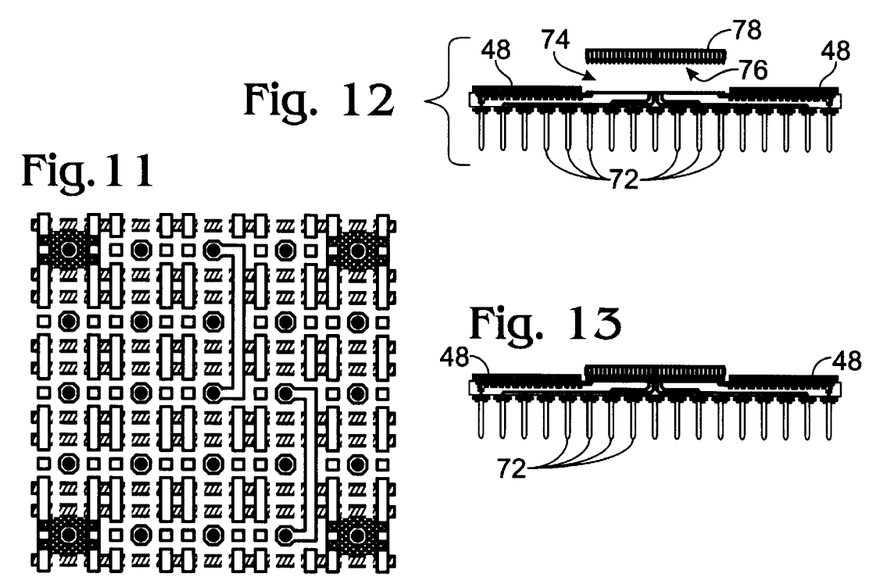
FIG. 11 is a portion of a typical wiring pattern after machining to sever the unwanted connections using a "cut-all" technique to establish the desired wiring pattern of FIG. 9 by severing all possible locations except those needed to form the desired pattern.
FIG. 12 is an exploded view of one simplified form of an electronic device using the concepts of this invention with the devices positioned on a combined footprint and device plate outboard of the intended position of the electrical conduction plate with the electrical conduction plate shown directly above in position ready for assembly.
FIG. 13 is a cross sectional view of the assembled device of FIG. 12.

In FIG. 11 a pattern is shown in which a cut-all concept is utilized. The cut pattern machines away all wires except the ones in the signal path. This configuration minimizes the chances of shorts, cross talk and unwanted grid connections but requires the maximum number of cuts.

With specific reference to FIGS. 12–16 there are shown various specific configurations of electronic arrays or systems incorporating the teachings of this invention. In FIG. 12 an exploded view of a simplified device which may have a plurality of chips 48 mounted upon combined footprint and device plate 70.

Plate 70 includes exposed pins 72 for interconnection to other devices or systems and which are routed to device plate terminals 74 as shown. Electrical conduction plate 78 is formed as generally described above with respect to FIGS. 5–11, 17 and 18. It has on its lower surface a plurality of electrical conduction plate terminals 76 arrayed to mate with device plate terminals 74. The assembled device is shown in FIG. 13. An advantage of this configuration is the ability to control the thermal environment of the devices 48 inasmuch as they are exposed at the outer periphery of the device stack and can be cooled or warmed by circulation of air or other heat transfer media.

Figure 14:
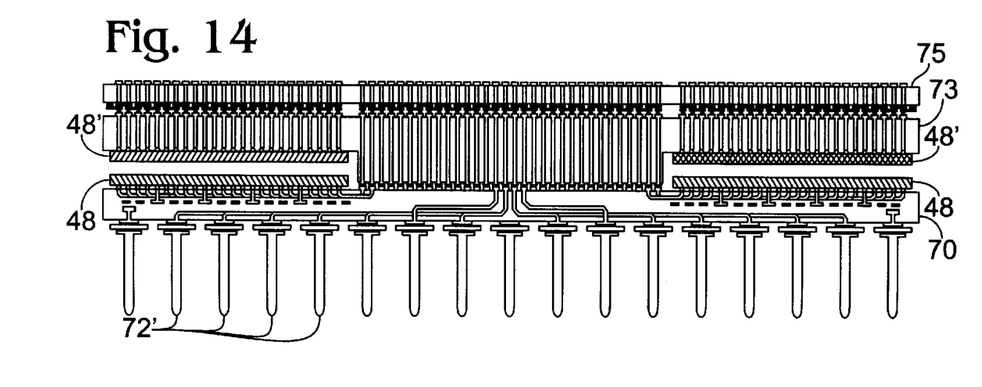
FIG. 14 is a cross sectional view of and electronic apparatus formed according to the teachings of this invention in which a footprint-device plate is positioned beneath a device plate with an electrical conduction plate superimposed thereupon.

A more complex device is shown in FIG. 14 in which a electrical conduction plate, a device plate 73 and a combined footprint and device plate 70 both prepared according to the teachings of this invention are shown assembled together.

Exposed pins 72' are routed as shown to a central location for contact with terminals on device plate 70. Chips or other devices 48 are routed to the interior locations as shown to mate with other device plate terminals on device plate 73. Chips or other devices 48' are shown attached to device plate 73 with conductors extending therethrough to terminal locations for contact with electrical conduction plate terminals. Electrical conduction plate 75 is shown in its operative position engaging the terminals of device plate 73. Electrical conduction plate 75 is constructed according to the discussion above with respect to FIGS. 5–11, 17 and 18 and serves to form the circuitry to advantageously use the characteristics of devices 48, 48' and the device plates upon which they are mounted.

Figure 15:
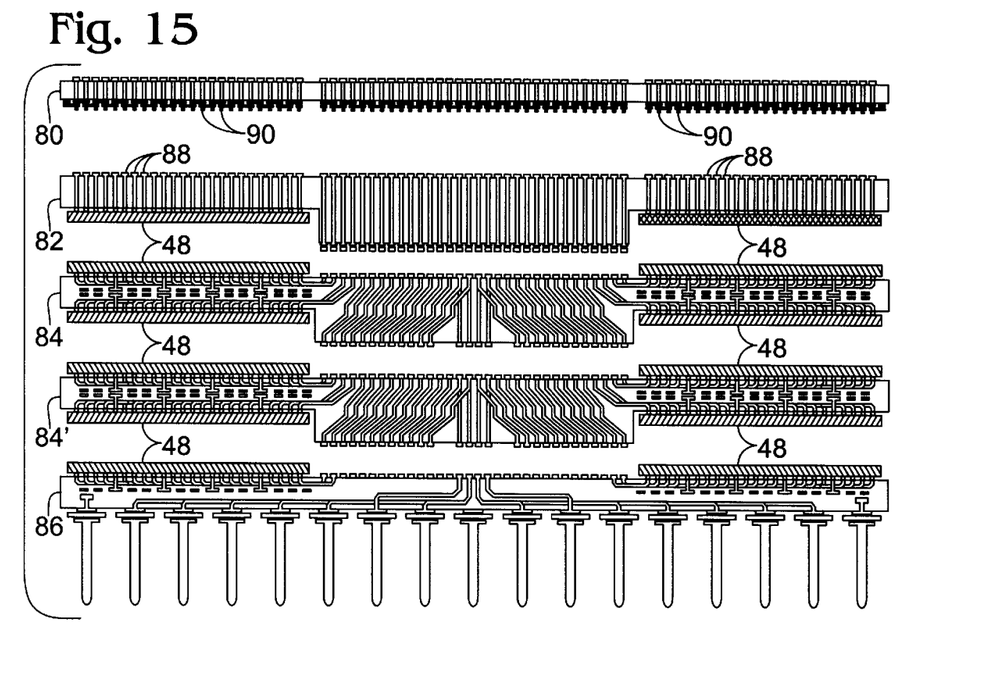
FIG. 15 is an exploded cross sectional view of an electronic apparatus formed according to the teachings of this invention similar to that shown in FIG. 14 with an additional device plate added to the stack.
Figure 16:
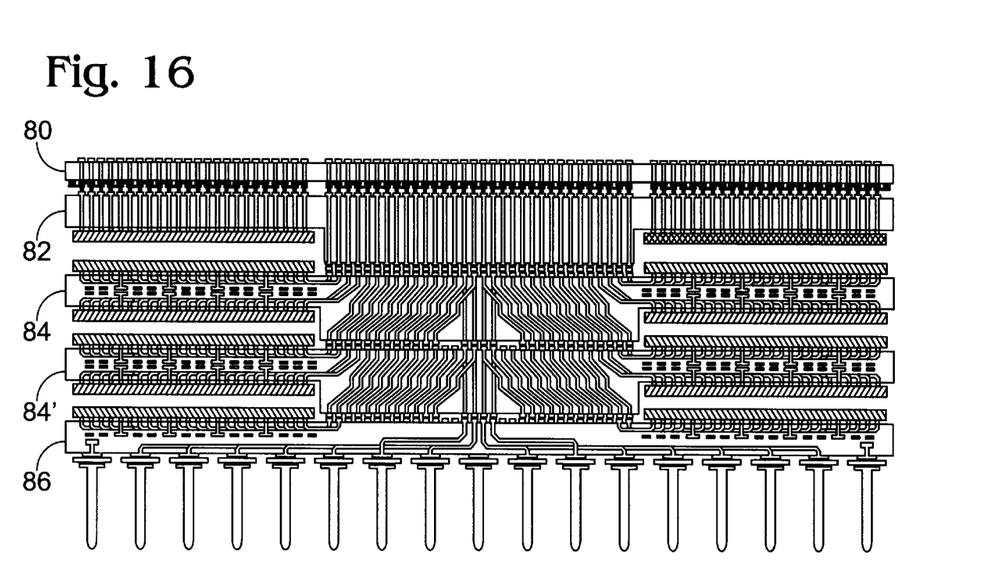
FIG. 16 is a cross sectional view of the device shown in FIG. 15, assembled and operational.

In FIGS. 15 and 16 a somewhat more complex electronic system is shown in which a electrical conduction plate 80, a device plate with direct vias 82, two electrical conduction plates with angled vies 84 and 84' and a combined device plate and footprint 86 are shown assembled together in an array permitting the use of many chips or other devices 48.

Figure 19:
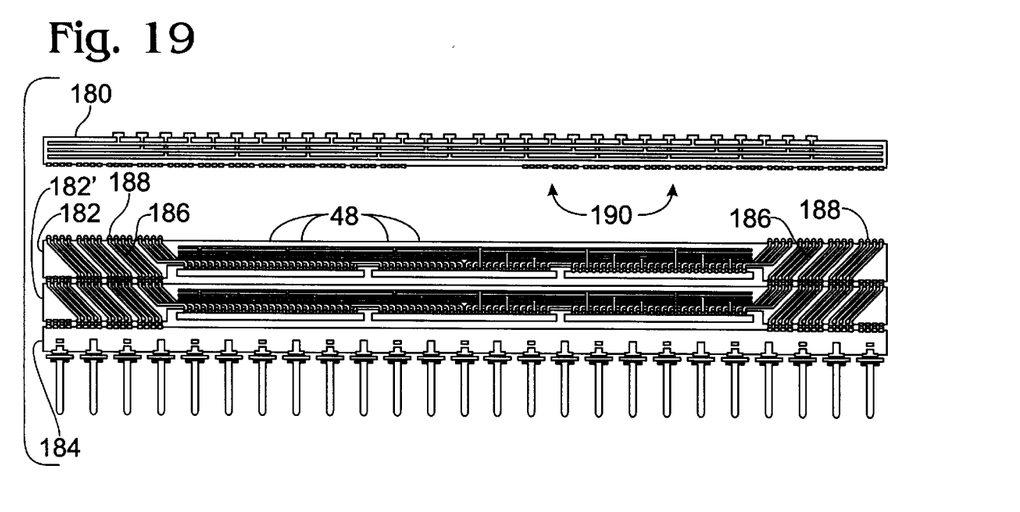
FIG. 19 is a schematic cross sectional view of an electronic apparatus formed according to the teachings of this invention in which conductors are positioned at the periphery of the plates of FIG. 12.
Figure 20:
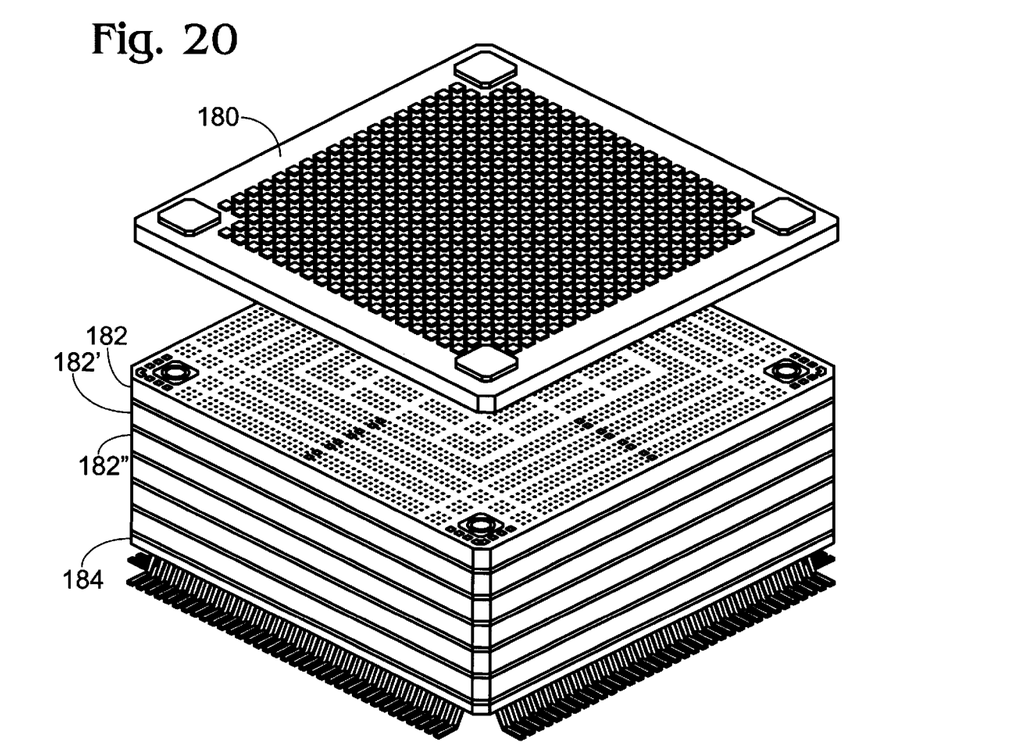
FIG. 20 is a pictorial view of the apparatus of FIG. 19, wherein five device plates are shown assembled.

An additional embodiment of the multiple chip or device system is shown in FIGS. 19 and 20. Here the conductors or vias which conduct signals, ground, power and the like through the stacked device plates are positioned at the periphery of the plates instead of the central location shown in FIGS. 12–16. In FIGS. 19 and 20, electrical conduction plate 180 is shown at the top of a stack of device plates 182, 182', 182", and more if desired. Each of the device plates of this embodiment have angled vias to conduct the signals, power, ground and the like to the adjacent plate, so that many discrete pathways can be accommodated while having a potentially large number of plates carrying devices. The plates may also be equipped with thermal control conduits communicating with the centrally located chips 48 for maintaining the temperature at the desired level for optimum device operation.

The electrical conduction plate described above may be personalized for its intended application by using an array of electronic switches such as APTIX, I-CUBE, Lattice, and Texas Instruments switches to connect and/or disconnect selected portions of the array of conducting paths. Personalization can also occur with a pattern of conductors deposited on a substrate by various means including extrusion, stitch wiring, multiwire, laser assisted deposition thereby forming the desired pattern of conductors interconnecting predetermined terminals on the electrical conduction plate. Another alternative means of forming the desired array is to use a pattern of conductors and embedded integral array of electronic switching devices, such as one time programmable switches, eg fuse and antifuse, or reprogrammable switches such as $E^2$, or SRAM-Pass Transistor based.

Industrial Applicability

The concepts described above in relation to the invention will find applicability in the electronic circuitry devices, computers, and any microcircuit applications in which a certain and inexpensive assembly technique is desirable. Especially in complex electronic circuitry wherein high value devices are assembled in a array of elements and in which it is desirable to be able to determine the operability of individual components as well as defects in devices or their plate connections the method and apparatus of this invention will find use.

In compliance with the statute the invention has been described in a language more or less specific as to structural features. It is to be understood, however, that the invention is not limited to the specific features shown since the means and constructions herein disclosed comprise a preferred form of putting the invention into effect. The invention is, therefore, claimed in any of its forms or modifications within the legitimate and valid scope of the appended claims appropriately interpreted in accordance with the Doctrine of Equivalence.

What is claimed is:

1. A method for reconfigurably forming an electrical circuit interconnect, comprising:

providing a device plate having a first set of terminals for electrical connection with one or more electrical devices and a second set of terminals, electrically connected to said first set of terminals, for electrical connection of said electrical devices to a conduction plate;

mounting one or more electrical devices on said device plate in electrical connection with respective selected terminals of said first set of terminals of said device plate without forming said electrical circuit, said one or more electrical devices having a plurality of device terminals for electrical connection to said first set of terminals of said device plate;

providing said conduction plate having a set of conduction plate terminals corresponding to said second set of terminals of said device plate and a circuit pattern of conductors electrically interconnecting selected combinations of said set of conduction plate terminals so as to define the electrical circuit to be formed; and releasably placing said set of conductor plate terminals of said conduction plate in direct contact with said second set of terminals of said device plate so as to electrically connect said set of conduction plate terminals and said circuit pattern of conductors of said conduction plate with said second set of terminals of said device plate so as to interconnect with said first set of terminals of said device plate and said plurality of said device terminals of said electrical device, thereby forming said electrical circuit.

2. The method of claim 1, further comprising the step of forming said first and said second set of terminals to extend laterally from said electrical devices to contact pads located remote from said electrical devices.

3. The method of claim 2, further comprising the step of providing three or more said device plates stacking said device plates to form a stacked array in which one of said device plates is between a subadjacent device plate and a superadjacent device plate, said one device plate connecting said second set of terminals of said subadjacent device plate to respective terminals of said first set of terminals on said super-adjacent device plate.

4. The method of claim 1, further comprising forming said pattern of conductors of said conduction plate by removing selected conductive material from said conduction plate.

5. The method of claim 1, further comprising the step of forming said pattern of conductors of said conduction plate by a step of making one or more links between said conductors.

6. The method of claim 5, wherein said step of making one or more links includes electrically connecting a wire between selected portions of said conductors.

7. The method of claim 1, further comprising the step of providing two or more layers of said conductors in said conduction plate, said layers being separated from one another by a dielectric, said layers being electrically connected to one another through a plurality of nodes.

8. The method of claim 1, further comprising the step of forming said pattern of conductors for testing said device plate.

9. The method of claim 1, further comprising the step of forming said pattern of conductors for testing said electrical devices.

10. The method of claim 1, further comprising determining whether said step of placing said conduction plate in direct contact with said device plate produces an operating circuit by, prior to said step of placing, testing said device plate and testing said one or more electrical devices.

* * * * *